United States Patent
Manku et al.

(10) Patent No.: US 7,742,747 B2
(45) Date of Patent: Jun. 22, 2010

(54) AUTOMATIC IIP2 CALIBRATION ARCHITECTURE

(75) Inventors: Tajinder Manku, Waterloo (CA);
Abdellatif Bellaouar, Richardson, TX (US); Alan Holden, McKinney, TX (US); Hamid R. Safiri, Dallas, TX (US)

(73) Assignee: Icera Canada ULC, Calgary (CA)

( * ) Notice: Subject to any disclaimer, the term of this patent is extended or adjusted under 35 U.S.C. 154(b) by 682 days.

(21) Appl. No.: 11/626,964

(22) Filed: Jan. 25, 2007

(65) Prior Publication Data
US 2008/0182537 A1    Jul. 31, 2008

(51) Int. Cl.
*H04B 1/04* (2006.01)
*H04K 3/00* (2006.01)

(52) U.S. Cl. ............... 455/114.1; 455/295; 455/296

(58) Field of Classification Search ... 455/114.1–114.2, 455/115.1, 226.1, 295–296, 310, 317
See application file for complete search history.

(56) References Cited

U.S. PATENT DOCUMENTS 7,340,234 B2 * 3/2008 Jun et al. ............... 455/232.1
7,561,862 B2 * 7/2009 Woo-nyun ............... 455/226.1
2006/0073803 A1 * 4/2006 Igarashi et al. ............... 455/296

FOREIGN PATENT DOCUMENTS

| EP | 0 473 373 | 3/1992 |
| EP | 1 067 675 | 1/2001 |
| WO | WO 03/065602 | 8/2003 |

* cited by examiner

*Primary Examiner*—Lee Nguyen
(74) *Attorney, Agent, or Firm*—Dennis R. Haszko

(57) ABSTRACT

An integrated automatic IIP2 calibration architecture for wireless transceivers is disclosed. The architecture enables a wireless transceiver to generate a test radio frequency (RF) signal having a second order tone with minimal additional circuitry. In particular, the test RF signal is generated using a combination of native transceiver circuits and test adaptor circuits. Native transceiver circuits are those circuits implemented on the transceiver chip for executing native transceiver functions during normal operation, which can be used for generating the test (RF) signal. Test adaptor circuits are added to the transceiver chip, more specifically to the native circuits, for enabling the native circuits to generate the test RF signal in a self-test mode of operation. Circuits for implementing a particular IIP2 minimizing scheme can be included on the transceiver chip for automatic IIP2 calibration during the self-test mode of operation.

18 Claims, 9 Drawing Sheets

AUTOMATIC IIP2 CALIBRATION ARCHITECTURE

FIELD OF THE INVENTION

The present invention relates generally to wireless communications. More particularly, the present invention relates to transceiver circuits.

BACKGROUND OF THE INVENTION

Wireless devices have been in use for many years for enabling mobile communication of voice and data. Such devices can include mobile phones and wireless enabled personal digital assistants (PDA's) for example. FIG. 1 is a generic block diagram of the core components of such wireless devices. The wireless core 10 includes a base band processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18. Those of skill in the art should understand that FIG. 1 is a simplified block diagram, and can include other functional blocks that may be necessary to enable proper operation or functionality.

Generally, the transmitter core 20 is responsible for up-converting electromagnetic signals from base band to higher frequencies for transmission, while receiver core 16 is responsible for down-converting those high frequencies back to their original frequency band when they reach the receiver, processes known as up-conversion and down-conversion (or modulation and demodulation) respectively. The original (or base band) signal may be, for example, data, voice or video. These base band signals may be produced by transducers such as microphones or video cameras, be computer generated, or transferred from an electronic storage device. In general, the high frequencies provide longer range and higher capacity channels than base band signals, and because high frequency radio frequency (RF) signals can propagate through the air, they are preferably used for wireless transmissions as well as hard-wired or fibre channels.

All of these signals are generally referred to as radio frequency (RF) signals, which are electromagnetic signals; that is, waveforms with electrical and magnetic properties within the electromagnetic spectrum normally associated with radio wave propagation.

FIG. 2 is a circuit diagram of a direct conversion receiver core that can be used in the wireless transceiver 10 of FIG. 1. As shown in FIG. 2, the receiver core 16 can include a low noise amplifier 30, a mixer 32, a variable gain amplifier (VGA) 34, a filter 36, an analog to digital converter (ADC) 38 and a digital processing circuit 40. VGA 34, filter 36, ADC 38 and digital processing circuit 40 can be considered signal processing circuitry since they collectively condition the RF input signal RFin for use by downstream circuits such as the baseband processor. While not expressly shown in the circuit of FIG. 2, those skilled in the art should understand that there are separate i and q signal propagation paths. This listing of components in receiver core 16 is not comprehensive, and any person of skill in the art will understand that the specific configuration will depend on the communication standard being adhered to and the chosen receiver architecture.

The general operation of the receiver core 16 is as follows. An RF input signal RFin is amplified by low noise amplifier 30, and then down-converted to baseband frequency R_CLK by mixer 32. This down-converted baseband signal is amplified to a desired level of gain by variable gain amplifier 34 in response to the level of gain control voltage VCONT, and then filtered through filter 36 to reduce the dynamic range of the signal. The resulting output signal is then converted to a digital signal D_SIGNAL by ADC 38. The digital signal D_SIGNAL can now be further processed in the digital domain by downstream circuits, such as digital processing circuit 40. In most configurations, digital processing circuit 40 provides a digital signal Dig_Out to the baseband processor.

In the presently shown direct conversion receiver core 16, a problem is the generation of second order intermodulation products (IIP2), which originates from mixer 32. An explanation of where IIP2 is generated follows with reference to FIGS. 3 and 4.

An example of a known differential mixer circuit is shown in FIG. 3. This differential mixer can be used as mixer 32 in FIG. 2. Differential pair mixer circuit 50 is an active mixing circuit, which includes a load resistor R1 and n-channel transistor 52 connected in series between a voltage supply VCC and a drain terminal of input n-channel transistor 54, and a load resistor R2 and n-channel transistor 56 connected in series between VCC and the same drain terminal of input n-channel transistor 54. The gate terminal of n-channel transistor 52 receives the signal z, and the gate terminal of n-channel transistor 54 receives the complement of the signal z denoted as z*. The gate terminal of input n-channel transistor 54 receives RF input signal x, and its source terminal is connected to VSS. The resulting complementary output signals y and y* are taken from the drain terminals of n-channel transistors 52 and 56 respectively. One output path 58 of mixer circuit 50 is between the drain of input n-channel transistor 54 and the node y, while the other output path 60 is between the drain of input n-channel transistor 54 and the node y*. In the context of mixer 32 of FIG. 2, signal x is equivalent to RFin, signals z and z* are equivalent to R_CLK and its complement R_CLK*, and signals y and y* are equivalent to the outputs of mixer 32.

A problem with this circuit lies in the non-linear nature of input transistor 54, which will generate an output y/y* having undesired intermodulation products. The current "I" through input transistor 54 can be expressed in equation (1) below:

$$I = g_m \cdot Vx, \text{ where } g_m \text{ is the transconductance and } Vx \text{ is the voltage of input signal } x \quad (1)$$

However, since $g_m$ of transistor 54 is a non-linear, the actual current "I" will be expressed by equation (2):

$$I = a_1 Vx + a_2 Vx^2 + a_3 Vx^3 + a_4 Vx^4 \quad (2)$$

where $a_1$, $a_2$, $a_3$ and $a_4$ are coefficients, and terms from $a_2$ and on are considered nth order intermodulation products.

The effect of the intermodulation products can be seen in the output y(t) of the mixer circuit 50 downconverted to baseband by z(t), which has a large frequency component at the RF signal frequency. FIG. 4a shows an input signal, x(t) made up of two tones $\omega_1$ and $\omega_2$. FIG. 4b shows the signal z(t), having a frequency tone at $\omega_z$ used to down convert the signal x(t). After down conversion, the tones $\omega_1$ and $\omega_2$ are displaced by $\omega_z$. FIG. 4c shows the displacement of $\omega_1$ and $\omega_2$ as $\omega_1 - \omega_z$ and $\omega_2 - \omega_z$ respectively. The tone $\omega_1 - \omega_2$ is generated by the second order term in equation (2) along with mismatches in 52 and 56 or R1 and R2. This tone effectively degrades the SNR of the radio. Thus, to mitigate the effect of second order intermodulation products, the linear relationship is ideally maintained by ensuring that all coefficients other than $a_1$ are zero, so that those terms will disappear.

However, because mixer circuit 50 is a differential-type circuit, the $a_2$ coefficient should be inherently reduced to zero. Differential circuits such as the one shown in FIG. 3 generally have two complementary data paths that should inherently cancel out any distortion components that may be introduced in them. In ideal conditions, differential-type circuits will set all even order terms $a_2$, $a_4$, $a_6$ etc.=0.

In practice however, the even order terms will cancel only if the two complementary data paths are identically matched. In mixer circuit 50 of FIG. 3 for example, the even order terms will cancel the characteristics of both resistors R1 and R2 are identical (ie. R1=R2), the electrical characteristics of both transistors 52 and 56 are identical, and the connections between transistor 54 to 52 and 54 to 56 are identical. In this situation both data paths can be considered matching. Therefore the second order intermodulation products should be inherently cancelled out.

However, this situation is ideal, and in practice the two data paths 58 and 60 are not electrically identical to each other. Semiconductor circuit layout and/or slight process variations and/or anomalies across the chip can introduce mis-match between the two paths. With reference to FIG. 3, the two load resistors can have slightly different values, or transistors 52 and 56 can have slightly differing doping levels or dimension differences, or un-balanced parasitic capacitance on the connections between the transistors, which are sufficient to cause mis-match in the paths. This mis-match can cause the second order intermodulation products to appear. The data path mis-match can be compensated for by trimming one or both load resistors, or by digitally switching in different valued resistors that are pre-formed on the chip. This is typically done during testing of the fabricated devices by detecting and measuring the amplitudes of the second order intermodulation products, and then selecting the appropriate resistor that minimizes the magnitude of the second order intermodulation products.

Another known scheme of minimizing second order intermodulation products is balancing, or matching, the complementary output paths of a mixer by directly adding or removing current from one of the paths. One example of a suitable scheme for minimizing second order intermodulation products in differential mixers is disclosed in commonly owned U.S. patent application Ser. No. 11/298,667, the entire contents of which are incorporated by reference.

In accordance with the scheme shown in U.S. patent application Ser. No. 11/298,667, mixer 32 of FIG. 2 receives an IIP2 compensation signal COMP for balancing its differential signal paths. Depending on the particular IIP2 minimizing scheme being used, COMP can be one or more digital or analog signals. With respect to the embodiments of the present invention, any IIP2 minimizing scheme can be employed.

Regardless of the IIP2 minimizing scheme employed, prior to application of an IIP2 compensation signal the wireless device must be tested for measuring or quantifying the amount of IIP2 being generated. Then the appropriate IIP2 compensation signals are generated and provided to the IIP2 minimizing scheme being employed.

FIG. 5 is a flow chart illustrating a generic IIP2 testing method for measuring IIP2 from a wireless device to be used in conjunction with an IIP2 minimizing scheme. Generally, the test involves application of an input signal to the chip, measuring the IIP2, and then applying some signal compensation to minimize the IIP2. It is assumed that the parameter being measured is a parameter compatible with a particular IIP2 minimizing scheme. This method is applied to a fabricated wireless device, such as a wireless transceiver chip, or a wireless system incorporating the wireless transceiver chip such as a mobile phone for example.

The method starts at step 70 where a test input signal is applied to an input port of the chip or system. Test signals can be generated with widely available testing equipment, and customized to include a second order tone. This is typically the same input through which a received RF signal will propagate to the receiver core. Alternately, the test input signal can be applied through a specific test input port. The entry point of the test signal is not important, as long as it is applied before the source of IIP2 generation and compensation. In the example receiver core 16 of FIG. 2, the input test signal can be applied before mixer 32. Alternately, the input test signal can be applied at the input of the low noise amplifier 30 or at the antenna port.

At step 72, the output of the chip or system is evaluated and the IIP2 parameter is measured. An appropriate compensation code or signal is generated at step 74, which is then applied to the IIP2 minimizing scheme, which then adjusts $\alpha_2=a_2$ to be zero. Fuses or other suitable programming means can be used for permanently storing the specific IIP2 compensation signal code either on chip or in the system.

Proceeding to step 76 after the compensation code is generated, if there are further chips or systems to test, then the method returns to step 70 for a subsequent testing loop for the next chip or system. This testing method repeats until there are no further chips or systems to test.

As previously mentioned, this method can be used for testing individual chips prior to packaging, or entire systems. At the chip level, each chip is tested, and the appropriate compensation programming is applied. For example, the programming can be done by blowing particular on-chip fuses or storing the appropriate compensation code in non-volatile memory prior to packaging. Alternately, each packaged chip can be tested and a corresponding compensation code is generated. This code can be used at the system level to compensate for the measured IIP2. At the system level, the IIP2 is measured as a function of the entire phone, and appropriate compensation circuits in the system can be appropriately enabled to minimize IIP2.

While the previously described method of FIG. 5 is effective for testing wireless chips and systems and minimizing IIP2, it is not very practical. In particular, the method is very cumbersome and time consuming to implement. This is due to the fact that circuit mismatch can vary from chip to chip, and accordingly, the IIP2 of each chip (or system) must be measured, and a corresponding compensation code valid only for that chip (or system) is provided. Moreover, relatively expensive test equipment such as signal generators and chip/system test apparatus are required. This cost increases if high testing throughput is required, otherwise testing will be time consuming. Therefore, IIP2 testing and compensation is both economically and/or time consuming.

BIST (built-in-self-test) schemes are presently used in other semiconductor systems, such as memory devices and controllers for example. Such self-testing is automatically executed by the chip, and can relieve the burden of using external test equipment and time for testing since the chip will have the necessary test circuits implemented thereon.

However, there are no known BIST schemes adapted for self-testing IIP2 and auto calibration in response to the measured IIP2. For self-contained test and IIP2 calibration, a test signal must be generated, in the same way that a test signal is applied in the testing scheme shown in FIG. 5. However, the addition of test signal generator circuits onto a wireless transceiver can consume substantial silicon area of the chip. Because the area of wireless transceiver devices should be minimized to make them attractive for high system integration in portable applications, such as mobile phones, the increase in chip area is undesired. Furthermore, as those skilled in the art will understand, an increased chip size will directly increase the cost for manufacturing the chip.

It is, therefore, desirable to provide a IIP2 calibration scheme that reduces testing time while minimizing the amount of additional on-chip circuits.

SUMMARY OF THE INVENTION

It is an object of the present invention to obviate or mitigate at least one disadvantage of previous IIP2 calibration schemes. In particular, it is an object of the present invention to minimize circuit overhead for implementing an IIP2 calibration scheme, while easing testing requirements.

In a first aspect, the present invention provides a second order intermodulation product (IIP2) calibration system for a wireless device. The calibration system includes a test signal generator, a receiver path and a calibration circuit. The test signal generator includes native circuits for generating a first radio frequency (RF) signal that is used to generate a second order tone. The receiver path has an input node for receiving the first RF signal, circuits for down-converting the first RF signal into a second RF signal based on a receive frequency, and signal processing circuits for generating a digital data signal corresponding to the second RF signal, the circuits receiving a compensation signal for minimizing the second order tone. The calibration circuit measures said second order tone in said digital data signal and generates the compensation signal.

According to embodiments of the present aspect, the native circuits of the wireless transceiver can include an oscillator circuit for generating a base frequency signal, and the test signal generator can further include a test adaptor circuit for adding an offset signal for generating a second order tone. The test adaptor circuit generates the first RF signal in response to the base frequency signal. The native circuits of the wireless transceiver can include a receiver clock circuit for generating the base frequency signal, where the base frequency signal is derived from the receive frequency. Alternately, the native circuit of the wireless transceiver can include a transmitter core circuit for generating the first RF signal.

In an aspect of the present embodiment, the transmitter core circuit can include a transmit baseband generator circuit and a transmit path circuit. The transmit baseband generator circuit generates the base frequency signal and the transmit path circuit receives this signal. The transmit path circuit mixes the base frequency signal with a high frequency carrier signal that is derived from the receive frequency.

According to another embodiment of the present aspect, the test adaptor circuit can include an offset generator, a mixing circuit, and a switch circuit. The offset generator provides the offset signal. The mixing circuit mixes a replica base frequency signal with the offset signal to provide first RF signal. The switch circuit selectively couples the first RF signal to the input node of the receiver path in a test mode of operation. The offset generator can include a test signal generator for providing a digital test signal, and a digital to analog converter for receiving the digital test signal, and for converting the digital test signal into an analog signal corresponding to the offset signal. The digital to analog converter can be a component of a transmit path circuit. In a further embodiment, the test adaptor circuit includes a test signal generator for generating the offset signal, and a switch circuit for selectively coupling the first RF signal to the input node. The offset signal is a preset digital signal in the test signal generator.

In a second aspect, the present invention provides a method for on-chip generation of an radio frequency (RF) test signal having a second order tone. The method includes generating a base frequency signal from a native circuit; generating an offset signal corresponding to the second order tone with a test circuit; and mixing the base frequency signal with the offset signal to generate the RF test signal. According to embodiments of the present aspect, the step of generating the base frequency includes enabling a receive clock generator circuit or a transmit clock generator circuit. In an embodiment of the present aspect, the preset digital test signal is converted into the analog offset signal. In a further embodiment of the present aspect, the offset signal is a preset digital test signal, the step of mixing is executed by a native transmit path circuit, and the step of generating the offset signal includes converting the offset signal into an analog signal. A power amplifier of the native transmit path circuit is disabled while the RF test signal is generated.

In a third aspect, the present invention provides a method for second order intermodulation (IIP2) testing and calibration of a wireless device. The method includes a) detecting a calibration event; b) generating a radio frequency (RF) test signal having a second order tone with native circuits of the wireless device; c) propagating the RF test signal through a receive path of the wireless device; d) measuring a parameter of the second order tone, which may be a DC tone in baseband and generating a corresponding compensation signal; and e) adjusting one or more circuits of the receive path with the compensation signal for minimizing the second order tone. The step detecting can include detecting one of a power up reset event, power on event and any preset enabling event. The step of generating the RF test signal can include generating a base frequency signal from a native circuit; generating an offset signal corresponding to the second order tone with a test circuit; and mixing the base frequency signal with the offset signal to generate the RF test signal. The step of propagating can include coupling the RF test signal to the receive path in response to the calibration event. The step of detecting can include decoupling an antenna from the receive path and/or the transmit path.

According to embodiments of the present aspect, the step of generating the base frequency can include enabling a receive clock generator circuit, the offset signal is an analog signal corresponding to a preset digital test signal, where the preset digital test signal is converted into the analog signal, and the step of generating the base frequency can include enabling a transmit clock generator circuit.

In another embodiment of the present aspect, the offset signal is a preset digital test signal, the step of mixing is executed by a native transmit path circuit, and the step of generating the offset signal includes converting the offset signal into an analog signal. A power amplifier of the native transmit path circuit can be disabled while the RF test signal is generated.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

An integrated automatic IIP2 calibration architecture for wireless transceivers is disclosed. The architecture enables a wireless transceiver to generate a test radio frequency (RF) signal that will generate a second order tone with minimal additional circuitry. In particular, the test RF signal is generated using a combination of native transceiver circuits and additional test adaptor circuits. Native transceiver circuits are those circuits implemented on the transceiver chip for executing native transceiver functions during normal operation, which can be further used for generating the test (RF) signal. Test adaptor circuits are added to the transceiver chip, more specifically to the native circuits, for enabling the native circuits to generate the test RF signal in a test mode of operation. Circuits for implementing a particular IIP2 minimizing scheme can be included on the transceiver chip for automatic IIP2 calibration during the test mode of operation.

Therefore, by minimizing the amount of added circuitry to the transceiver chip, reduced costs are realized. By having the RF test signal generated on chip and the IIP2 minimizing scheme implemented on chip, the wireless transceiver chip can be easily programmed to execute an IIP2 calibration algorithm at any time. More importantly, the IIP2 testing and calibration does not have to be performed at the chip or system manufacturing stage. Instead, the IIP2 calibration algorithm can be initiated after the entire system has been assembled and delivered to the user. Hence, the prior problem of long testing times is eliminated.

Figure 6:
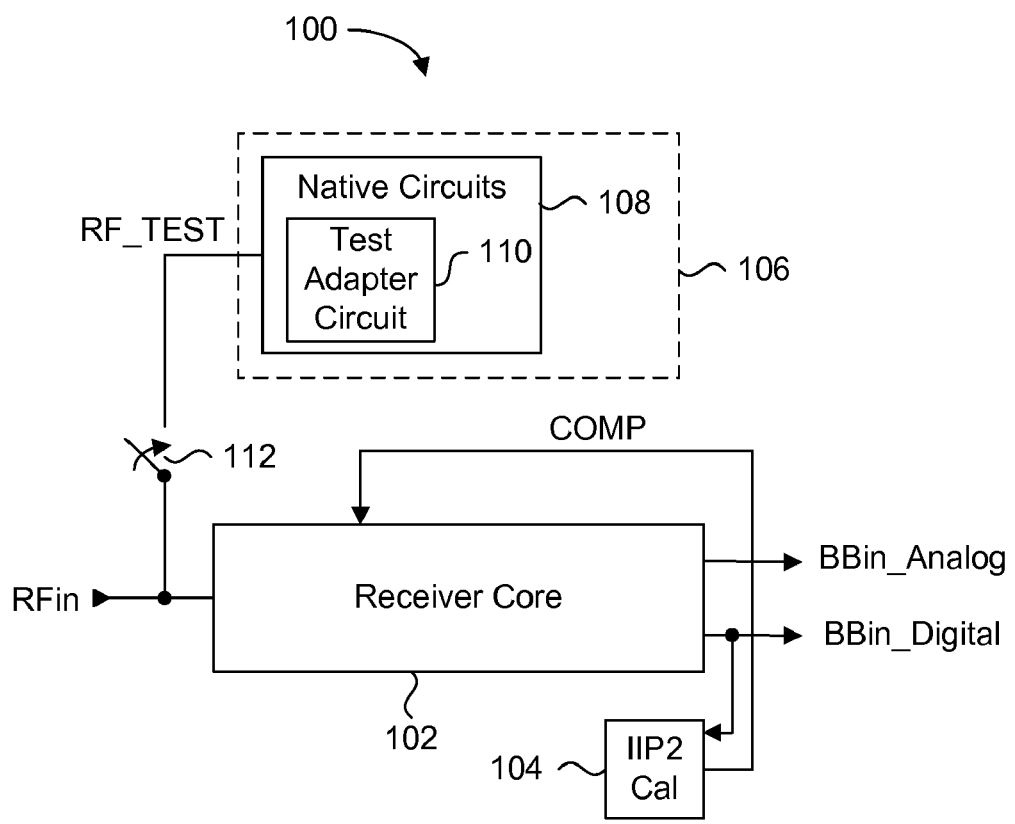
FIG. 6 is a block diagram of an integrated automatic IIP2 calibration architecture, according to an embodiment of the present invention.

A generic embodiment of the integrated automatic IIP2 calibration system is shown in FIG. 6. The preferred feature illustrated by the embodiment of FIG. 6 is the reuse of as many of the existing native circuits that are inherently required for normal operation of the transceiver circuit, for generating an RF test signal. By doing so, the addition of new circuits dedicated for generating the RF test signal is minimized. This reduces area of the chip, and ultimately, cost.

Figure 1:
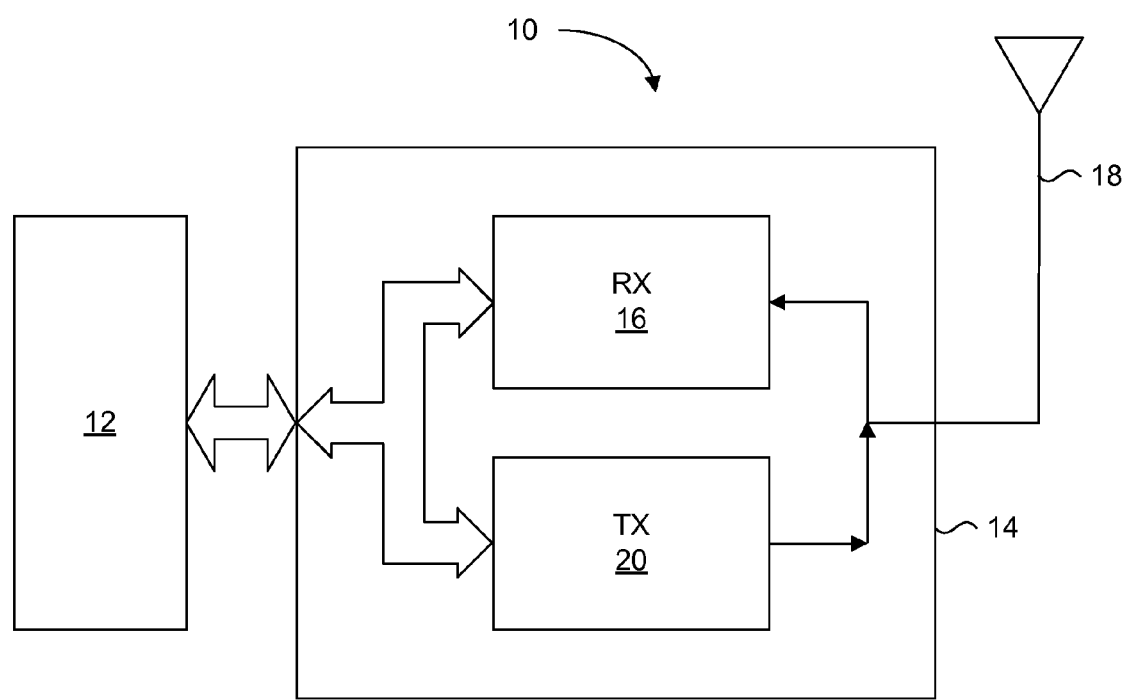
FIG. 1 is a block diagram of the core of a wireless device.
Figure 2:
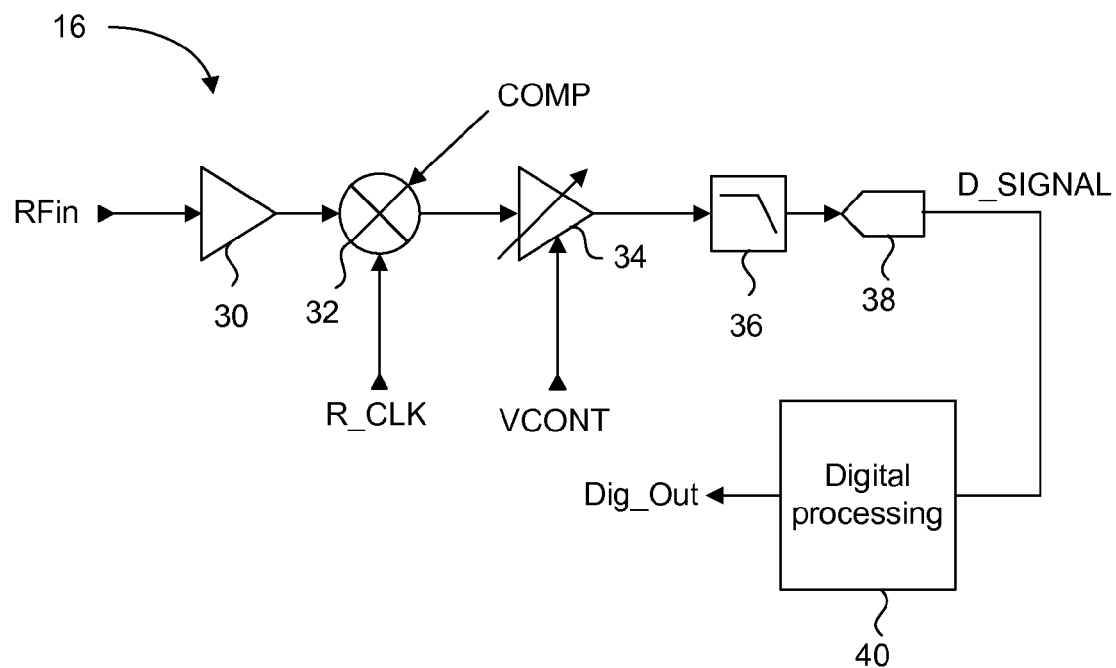
FIG. 2 is a circuit diagram of a receiver core shown in the wireless device of FIG. 1.
Figure 3:
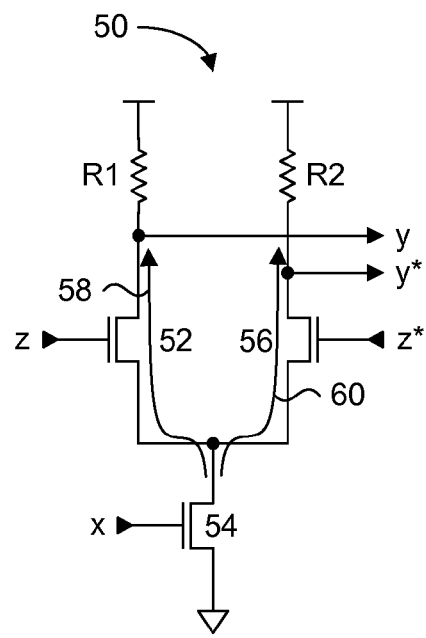
FIG. 3 is a circuit schematic of a prior art active mixer circuit.
Figure 4A:
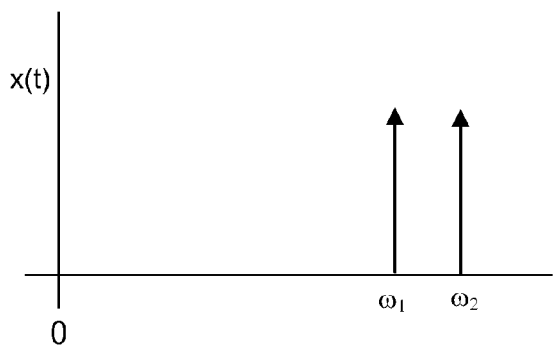
FIGS. 4a, 4b and 4c are power spectrum plots illustrating second order tones resulting from a direct conversion operation.
Figure 4C:
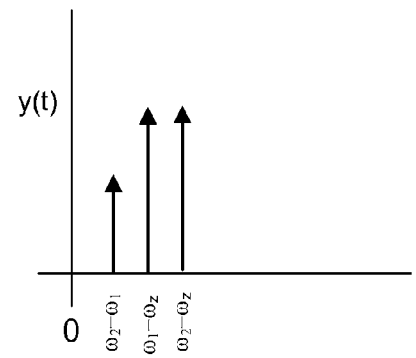
Figure 4B:
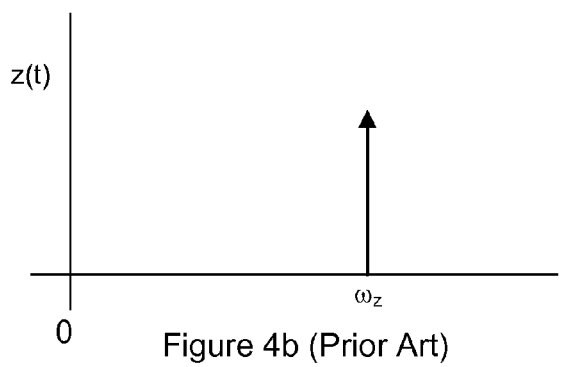
Figure 5:
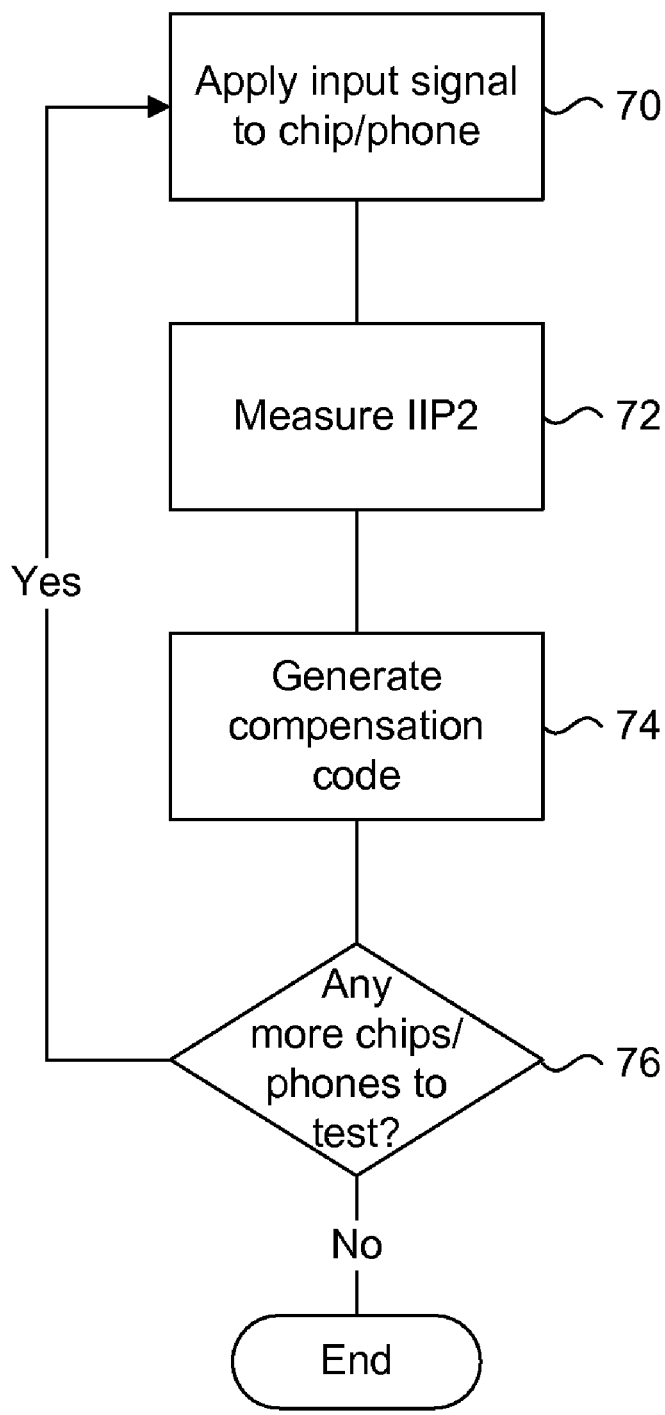
FIG. 5 is a flow chart illustrating a method for testing and compensating for IIP2 in a wireless transceiver or wireless system.

Automatic IIP2 calibration system 100 includes a receiver core 102, which can be implemented with the circuit configuration of receiver core 16 shown in FIG. 2, an IIP2 calibration circuit 104 and a test signal generator 106. Receiver core 102 receives an RF input signal RFin from the antenna, and generates corresponding baseband signals BBin_Analog and BBin_Digital for the baseband processor. It is noted that some baseband processors can accept either digital or analog signals, and this particular embodiment merely illustrates that receiver core 102 can provide one or both formats of the signal. IIP2 calibration circuit 104 generically illustrates any type of IIP2 minimization scheme implementation. In this embodiment, IIP2 calibration circuit 104 receives the digital signal BBin_Digital for measuring a value of the second order tone in RF_TEST. An appropriate compensation or corrective signal COMP is then fed back to the specific circuit of receiver core 102 where IIP2 is to be minimized. The IIP2 calibration circuit 104 is preferably integrated in the digital processing circuit 40 of FIG. 2, but can be implemented a distinct circuit on the chip.

Test signal generator 106 consists of native circuits 108 coupled with test adaptor circuits 110 for generating a test RF input signal RF_TEST that will generate a second order tone in the receive core 102. A native circuit is defined as any circuit already existing as part of the wireless transceiver design for executing normal wireless transceiver functions. By definition, a receiver core and transmit core of a wireless transceiver are native circuits since they are used during wireless communication operations. In contrast, a test circuit such as test adaptor circuit 110 is one that is added to the wireless transceiver design for executing one or more specific test functions that are not executed by the transceiver during normal operations. By example, IIP2 calibration circuit 104 is categorized as a test circuit since it typically does not operate during normal wireless communication operations.

Finally, a switch circuit 112 selectively couples RF_TEST to the input of receiver core 102 during a test, or calibration mode of operation. Preferably, the IIP2 calibration circuit 104 is enabled only during the test mode of operation. It is further noted that node RFin is preferably isolated from the external antenna of the system during the calibration mode to avoid the introduction of unwanted signals which may be received by the antenna. Persons skilled in the art will understand that components of a particular system can be controlled to isolate the RFin node. For example, in the GSM half-duplex system, a switch connects the antenna to either the RFin node or the transmit core output node. Therefore, in the IIP2 calibration mode, node RFin is isolated by setting the switch to connect the antenna to the transmit core output node.

In a normal mode of operation, switch circuit 112 is open to disconnect the output of test signal generator 106 from the input node RFin, while test adaptor circuit 110 and IIP2 calibration circuit 104 are disabled. The receiver core 102 and native circuits 108 will execute their normal wireless transceiver functions. For example, receiver core 102 can receive and process RF signals from the system antenna for the baseband processor.

In an IIP2 calibration test mode, the test adapter circuit 110 is enabled and with the appropriate native circuits 108, a test RF signal is generated. This test RF signal is fed into the RFin node of the receiver core 102.

The IIP2 calibration circuit 104 measures values of the signal, and generates a corresponding compensation control signal(s), which are fed back to one or more circuits of the receive core 102. Thus, when the system re-enters a normal mode of operation, the receiver core 102 will generate data signals for the baseband processor that are substantially free of second order intermodulation products. Preferably, the compensation signals are generated once and stored in some form of non-volatile memory for access at any time. As will be discussed later, the IIP2 calibration algorithm can be initiated at any time.

The native circuits 108 preferably consist of circuits that are part of the receive path or the transmit path, and in particular, circuits already implemented in the wireless transceiver for generating oscillating signals. Because circuits for generating oscillating signals tend to occupy relatively large silicon area, significant chip area can be conserved by reusing these existing native circuits.

Figure 7:
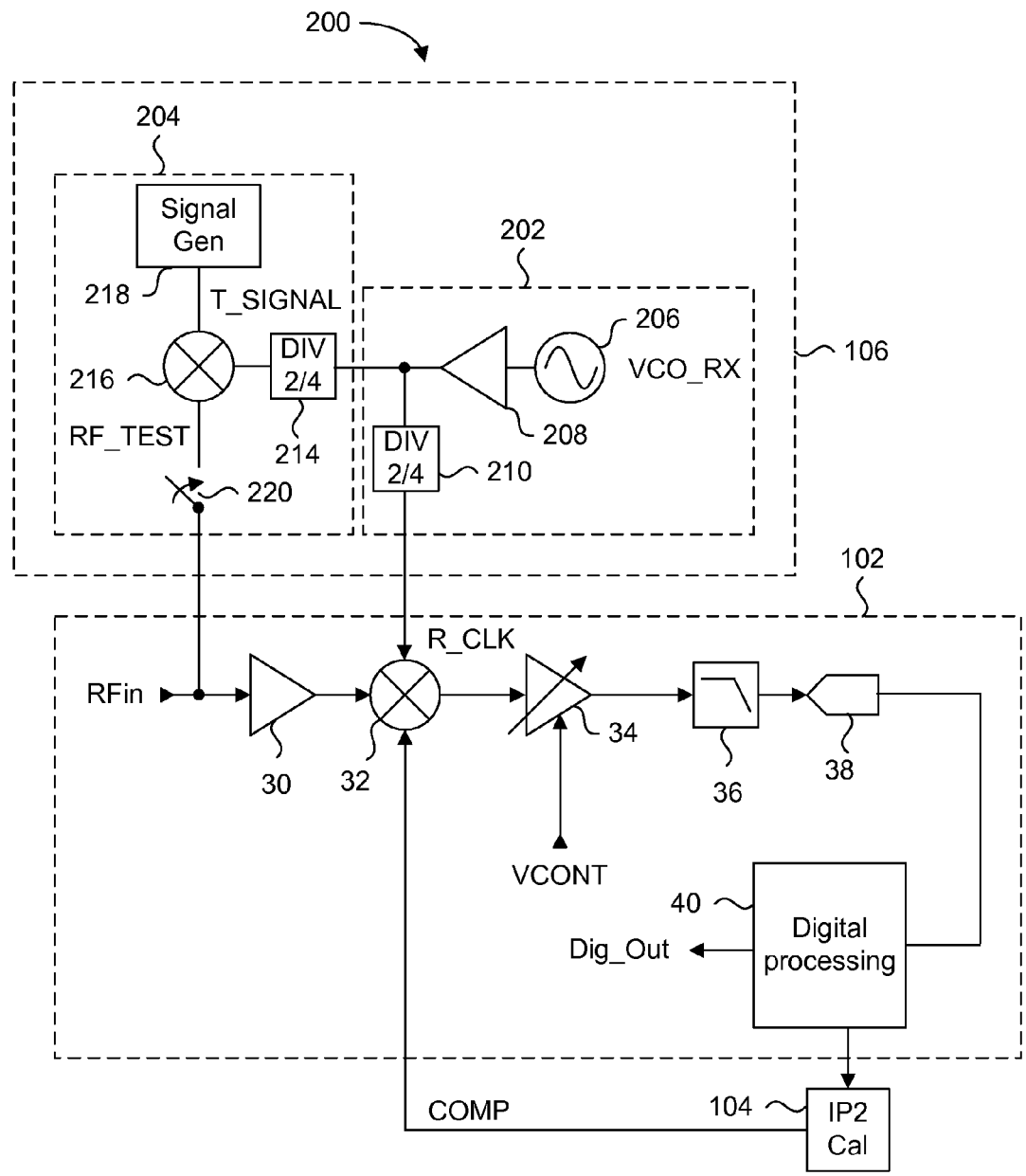
FIG. 7 is a circuit diagram of a receiver based automatic IIP2 calibration scheme according to an embodiment of the present invention.

FIG. 7 is a circuit schematic of an automatic IIP2 calibration system using native receive path circuits, according to an embodiment of the present invention. The mixer 32 of receiver core 102 requires a down-conversion clock signal R_CLK, which is generated by a corresponding receive clock generator circuit. This receive clock generator circuit is now used in the present embodiment for generating the test RF signal RF_TEST.

Automatic IIP2 calibration system 200 of FIG. 7 includes the same receiver core 102 of FIG. 6, implemented with the same components as shown in FIG. 2. The same numbered reference numerals refer to the same previously described elements of FIG. 2. Test signal generator 106 of FIG. 7 is implemented with a receive clock generator circuit 202 and a receive clock adaptor circuit 204. The receive clock generator circuit 202 is a circuit embodiment of the native circuits 108 of FIG. 6, while the receive clock adaptor circuit 204 is a circuit embodiment of test adaptor circuit 110 of FIG. 6.

The receive clock generator circuit 202 is a receive path circuit for generating down-conversion clock R_CLK for mixer 32 of the receiver core 102. This includes a voltage controlled oscillator 206 for generating a receive frequency, an amplifier or buffer 208 for amplifying the oscillating signal, and a divide by 2/4 circuit 210. The divide by 2/4 circuit 210 can be configured to divide the amplified signal by either 2 or 4, depending on the band being used. This divided signal is a carrier frequency signal R_CLK used by mixer 32 for down-converting received RF signals, including the received RF test signal RF_TEST during the calibration mode of operation. Those skilled in the art will understand that the configuration of receive clock generator circuit 202 represents one possible configuration, yet different configurations of receive clock generator circuit 202 can be used for generating down-conversion clock signal R_CLK.

The receive clock adaptor circuit 204 is responsible for using an output from the receive clock generator circuit 202 to generate the RF test signal RF_TEST having a signal that generates a second order signal in the receive path 102. This signal generates a second order tone that is detectable/measurable by the IIP2 calibration circuit 104. This is achieved by mixing a replica of the R_CLK signal with an offset sufficient to generate the second order tone in baseband. Those skilled in the art would understand that the second order tone may sit at DC. For example, if the frequency of R_CLK is 500 MHz, then the desired frequency of RF_TEST can be offset to be 505 MHz and 508 MHz. This would produce a second order tone at 3 MHz. However if RF_TEST is only a signal tone at 503 MHz, the second order tone would sit at 0 Hz or DC.

The receive clock adaptor circuit 204 includes a replica divide by 2/4 circuit 214 connected to the output of amplifier 208, a mixer 216, and an offset test signal generator 218. Replica divide by 2/4 circuit 214 generates the same base frequency signal as divide by 2/4 circuit 210. It is understood that the mixer 216 may consist of a quad and inphase mixer. A switch circuit 220 is controlled to connect the output of mixer 216 to the input node RFin of receiver core 102 during the calibration mode of operation. The offset test signal generator 218 provides a preset analog offset signal T_SIGNAL, which is mixed by mixer 216 with the output of replica divide by 2/4 circuit 214. While the inclusion of replica divide by 2/4 circuit 214 appears redundant since the output of divide by 2/4 circuit 210 can be tapped, it is preferable to replicate the divide by 2/4 circuit 214 since a tapped output from the divide by 2/4 circuit 210 will be unnecessarily loaded, degrading the performance of R_CLK. This is significant because the R_CLK is preferably a good quality signal, meaning that divide by 2/4 circuit 210 should be designed to have good noise performance. On the other hand, replica divide by 2/4 circuit 214 can be a low quality circuit relative to divide by 2/4 circuit 210. Accordingly, the circuit area of replica divide by 2/4 circuit 214 can be smaller than that of divide by 2/4 circuit 210. In the same way, mixer 216 can be implemented as a low quality passive mixer that is small in size. An optional digitally controlled attenuator block (not shown) can be inserted in-line between the output of mixer 216 and switch circuit 220.

Figure 8:
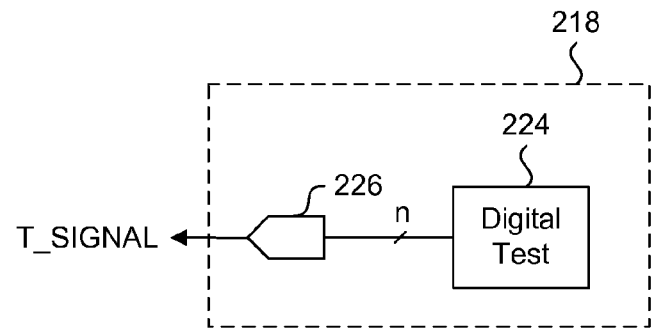
FIG. 8 is a block diagram of an offset test signal generator according to an embodiment of the present invention.

In the presently shown embodiment, the offset test signal generator 218 can be implemented with the circuit shown in FIG. 8. This circuit includes a digital test signal generator 224 that provides an n-bit digital signal to a digital to analog converter 226. The n-bit digital signal is preferably pre-programmed through a variety of means well known to those skilled in the art. The converted analog signal T_SIGNAL corresponds to the n-bit digital signal. The T_SIGNAL may also be made up of an inphase and quadrature signal by using two offset test signal generators 218.

Note that in a practical implementation, the receiver core 102 of FIG. 7 is duplicated for the i and q paths of the signal, however only a single IIP2 calibration circuit 104 is used for both the i and q receiver core circuits. Therefore, circuit designers should be aware that the replica divide by 2/4 circuit 214 can provide in phase and out of phase signals. In practice, a switch circuit can be included between the output of replica divide by 2/4 circuit 214 for selecting the particular phase to provide to mixer 216 when testing either the i or q signal path of receiver core 102. Of course, the switch circuit can be integrated within the replica divide by 2/4 circuit 214.

The previously described embodiment of FIG. 7 uses a native receive clock generator circuit 202 which is considered part of the receive path, for generating the RF test signal RF_TEST. The circuits of the receive clock adaptor circuit 204 requires the formation of additional circuits. As previously mentioned, mixer 216 and replica divide by 2/4 circuit 214 are not complex, and will not utilize significant silicon area. The offset test signal generator 218 on the other hand, includes a digital to analog converter, which adds more circuitry to the chip.

Figure 9:
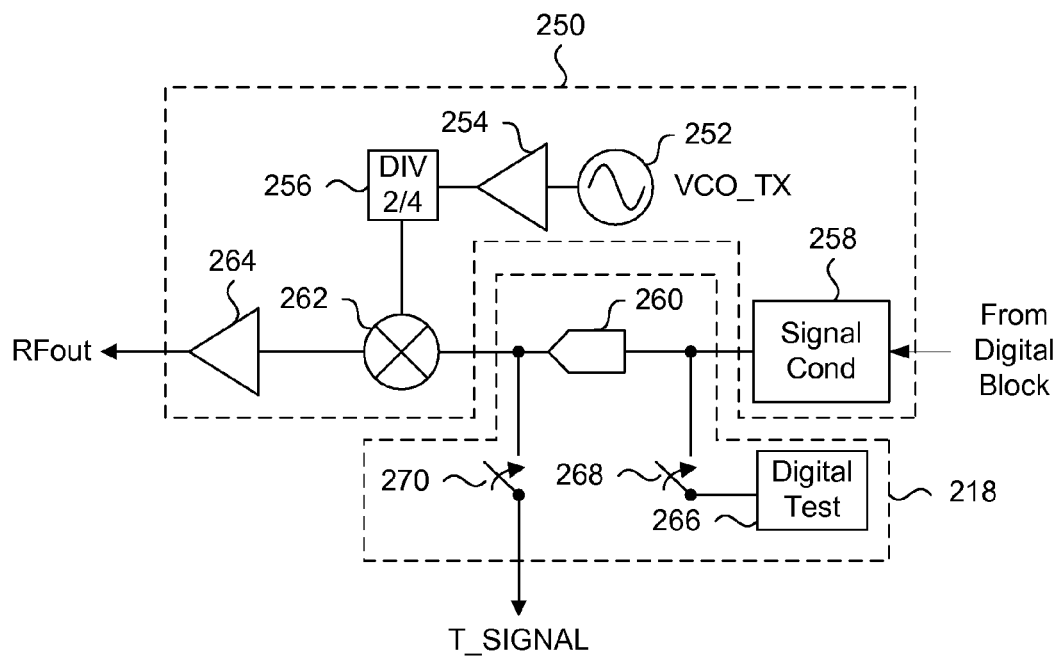
FIG. 9 is a block diagram of an offset test signal generator according to another embodiment of the present invention.

FIG. 9 illustrates an alternate embodiment of the offset test signal generator 218 of FIG. 7. In particular, the embodiment of FIG. 9 re-uses a circuit element of the native transmit path circuit 250 already present in the system. The native transmit path circuit 250, also known as a transmitter core circuit, includes a transmit clock generator circuit (also known as a transmit baseband generator) having a voltage controlled oscillator (VCO) 252, an amplifier 254 and a divide by 2/4 circuit 256. Divide by 2/4 circuit 256 provides a base frequency clock signal derived from VCO 252. The configuration of the transmit clock generator shown in FIG. 9 is one of several possible configurations known in the art that can be used.

The transmit path circuits include a signal conditioning circuit 258, a digital to analog DAC 260, a mixer 262, and a power amplifier 264. The transmit path circuits are responsible for generating the RF data signal to be transmitted. The signal conditioning circuit 258 can include several different circuits for conditioning a digital signal received from a baseband processor. These can include modulating circuits and filtering circuits, for example, but can also include any circuit that alters characteristics of the signal to be transmitted.

Offset test signal generator 218 includes a digital test signal generator 266, which can be the same as generator 224 from FIG. 8, and the digital to analog converter 260 from the transmit path circuits. In the present example, switch means 268 can be used for selectively de-coupling digital test signal generator 266 from the input of digital to analog converter 260, while switch means 270 can be used for de-coupling T_SIGNAL from the output of the digital to analog converter 260. The operation of offset test signal generator 218 is the same as previously described for FIG. 8, except that less additional components are required because the analog to digital converter component of a native circuit is used.

Those skilled in the art will understand that any digital to analog converter already on-chip for normal operations can be used in place of digital to analog converter 260 of the native transmit path circuit 250.

In another embodiment of the present invention, the amount of additional circuitry required for generating the test signal can be further minimized. The embodiment of FIG. 7 re-uses the receive clock generator circuit 202 of the receive path, but required the addition of at least a replica divide by 2/4 circuit 214 and a mixer 216.

Figure 10:
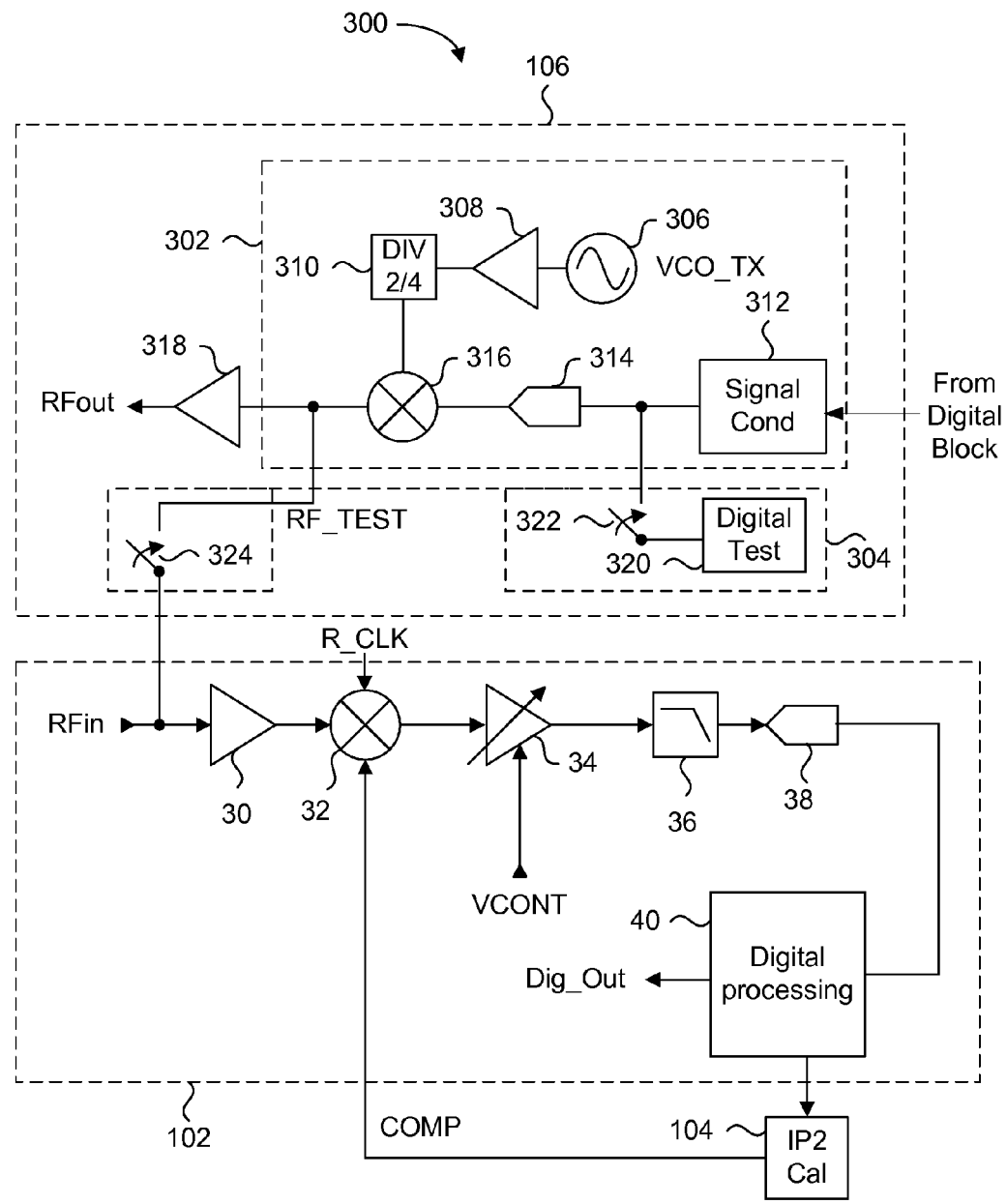
FIG. 10 is a circuit diagram of a receiver and transmitter based automatic IIP2 calibration scheme according to an embodiment of the present invention; and, FIG. 11 is a flow chart illustrating a method of automatically testing and calibrating for IIP2.

FIG. 10 shows an embodiment of the invention using transmit path circuits for generating a test signal. Automatic IIP2 calibration system 300 includes the same receiver core 102 and IIP2 calibration circuit 104 used in the embodiment of FIG. 7. Now test signal generator 106 is implemented with a transmit path circuit 302 and a transmit path adaptor circuit 304. The transmitter core circuit 302 generates an RF test signal RF_TEST having a desired offset, where the desired offset is provided by the transmit path adaptor circuit 304.

Transmitter core circuit 302 includes a transmit clock generator circuit that functions equivalently to the receive clock generator circuit 106 of FIG. 7, and a transmit path circuit. The transmit clock generator circuit provides a clock used by the transmit path circuit to up-convert a data signal for transmission. The transmit clock generator circuit includes a voltage controlled oscillator (VCO) 306, an amplifier 308 and a divide by 2/4 circuit 310. Divide by 2/4 circuit 310 provides a carrier frequency clock signal derived from VCO 306. The configuration of the transmit clock generator shown in FIG. 10 is one of several possible configurations known in the art that can be used.

The transmit path circuits include a signal conditioning circuit 312, a digital to analog DAC 314, a mixer 316, and a power amplifier 318. The transmit path circuits are responsible for generating the RF data signal to be transmitted. The signal conditioning circuit 312 can include several different circuits for conditioning a digital signal received from a baseband processor. These can include modulating circuits and filtering circuits, for example, but can also include any circuit that alters characteristics of the signal to be transmitted.

The transmit path adaptor circuit 304 includes a digital test signal generator 320 for generating an offset signal, a first switch 322 for coupling the generated offset signal to the input terminal of DAC 314, and a second switch 324 coupled between the output of power amplifier 318 and node RFin of the receiver core 102. The switch 324 may be placed anywhere after the mixer 316. For example, it may be placed at the output of 318 The offset signal can be digitally programmed, and have the same characteristics as the offset signal generated by the test signal generator 106 of FIG. 7. Persons skilled in the art will understand that a variety of circuits can be used for generating the preset digital offset signal having any number of bits. The digital test signal generator 320 and switch 322 can easily be integrated with the signal conditioning circuit 312 due to its small size. Adaptor circuit 304, digital test signal generator 320, and switch 322 may also be merged into a signal block in the digital domain.

In a normal mode of operation, ie. the transmit operation, the first switch 322 is set to an "open" position to decouple the output of digital test signal generator 320 from the input of DAC 314, while the second switch 324 is set to decouple the output of power amplifier 318 from node RFin. When transmitting, data received by signal conditioning circuit 312 is processed through the transmit path circuit 302 and provided as signal RFout for the antenna. More specifically, the conditioned digital signal is converted into an analog signal via DAC 314, where it is up-converted and amplified by mixer 316 and pre-power amplifier 318 respectively, for transmission through a downstream power amplifier and then an antenna (both not shown in FIG. 10). The operation of transmit path circuit 302 is well known in the art. Digital test signal generator 320 can be disabled during the normal mode of operation.

In a calibration mode of operation, the digital test signal generator 320 can be enabled and switches 322 and 324 are set to a "closed" position. Preferably, the output of signal conditioning circuit 312 is tri-stated, disconnected or simply disabled. Now the input terminal of DAC 314 receives the generated offset signal from digital test signal generator 320, which is processed through the transmit path circuit 302 and fed to the RFin node via closed switch 324. The antenna is preferably switched to the transmit mode since signals from the antenna should not be received at the RFin node. Furthermore, because the output of amplifier 318 is typically routed off-chip to the antenna and the transmit path circuit 302 is active during the calibration mode, the power amplifier 318 should be turned off, so as not to transmit the test signal into the air.

The embodiments of the automatic IIP2 calibration system shown in FIGS. 6, 7 and 10 show one test signal generator 106 coupled to one receiver core 102. It should be noted that each receiver core 102 can include multiple receive paths, although only one is shown in the embodiments of FIGS. 7 and 10. Each receive path can be dedicated to one particular frequency band, where each receive path includes i and q paths. This means that most of the circuits of receiver block 102 are implemented twice for each receive path. In a quad band transceiver, there would be a total of eight receive paths for which IIP2 calibration would be required. The specific configuration of the automatic IIP2 calibration system can be determined based on design limitations and the frequency plan of the chip. For example, if testing time is not important but minimizing chip area is critical, then one test signal generator 106 can be shared between two or more receive paths. Preferably, one test signal generator 106 is shared for receive paths of similar frequency bands. For such an implementation, the RF_TEST output will be selectively connected to the particular receive path that is enabled in the calibration mode of operation. Accordingly, the voltage controlled oscillator of the receive or transmit path (either 206 or 306) will be controlled to generate the corresponding frequency for the selected receive path. The number of receive paths each test signal generator 106 can be used with depends on the range of the voltage controlled oscillator (either 206 or 306). Since there is preferably one IIP2 calibration circuit 104 on the chip, each generated IIP2 compensation signal COMP for a respective receive path is stored in memory for subsequent access during normal modes of operation.

On the other hand, if testing time is important, and minimizing chip area is not important, then each receive path can have its own dedicated test signal generator 106 and IIP2 calibration circuit 104. Of course, the configurations are not limited to the two described above, and any suitable combination of the two configurations can be implemented. Those skilled in the art should understand that additional logic and/or switching circuits may be required to implement each configuration.

Figure 11:
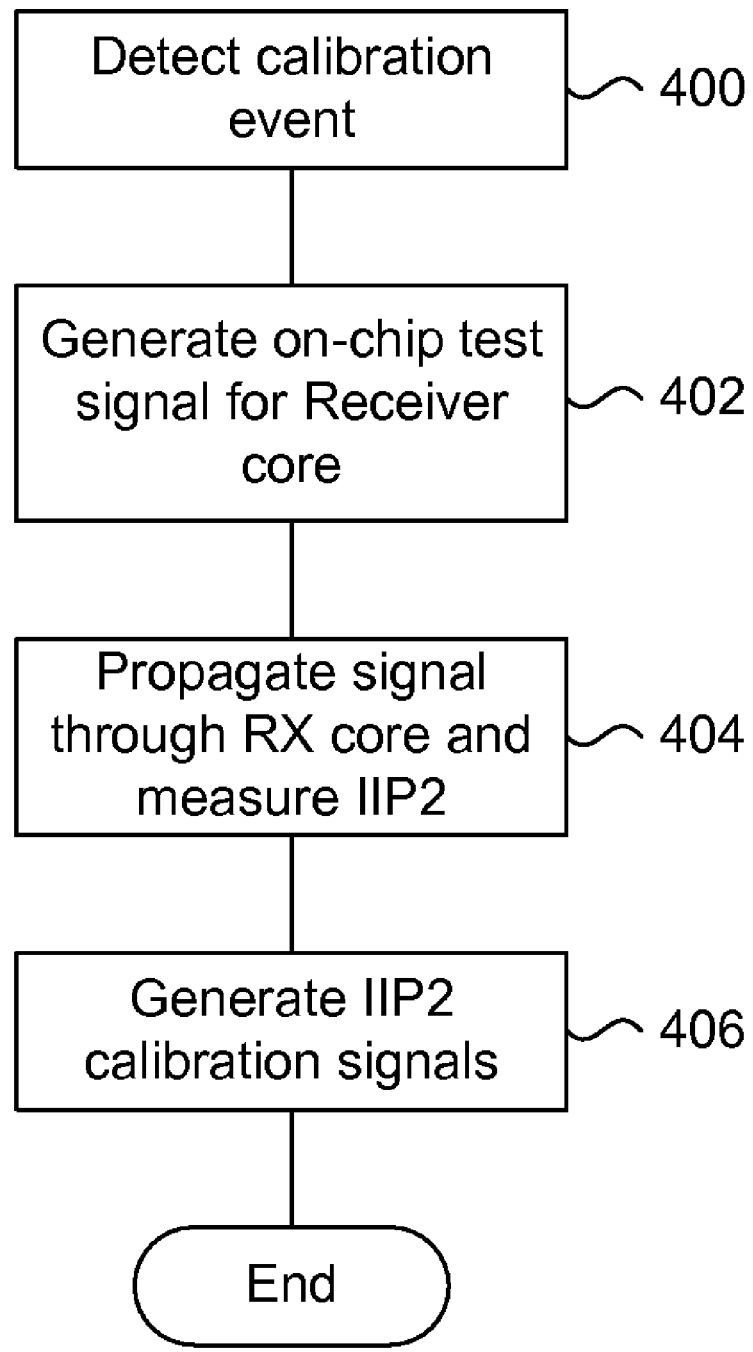

Following is a description of a method for testing a wireless transceiver using the automatic IIP2 calibration system embodiments of FIGS. 6 to 10. FIG. 11 is a flow chart illustrating the general sequence of the method. It is assumed that the wireless transceiver chip incorporating the embodiments of the present invention has been fabricated and integrated into a system, such as a mobile phone for example.

The method starts at step 400, where a calibration event is detected in order to initiate the IIP2 calibration test. A calibration event can be triggered automatically by the system, by user action, or during other standard tests executed during the chip testing or system assembly stage. Examples of automatic system triggering can include power up reset of the system (ie. battery insertion), enabling of the system or detection of a predetermined temperature change since the previous calibration. An example of user action triggering can include manual powering on of the system. In further response to detection of the calibration event, additional system components can be set to the necessary states. In the embodiment of FIG. 7 for example, the antenna switch can be set to connect the antenna to the transmitter core output, and switch circuit 220 can be closed to couple the eventually generated RF_TEST signal to the RFin node. In the embodiment of FIG. 10 for example, the antenna switch can be set to connect the antenna to the transmitter core output, switch circuit 324 can be closed, and power amplifier 318 can be disabled. Those skilled in the art will understand that other system components can be set as desired in response to the calibration event.

Proceeding to step 402, the automatic IIP2 calibration system is enabled and the RF test signal is generated and applied to at least one receiver path of the receiver core through the closed switch circuits (220 in FIG. 7 and 324 in FIG. 10). At step 404, the RF test signal RF_TEST is propagated through the at least one receiver path, where a parameter of the IIP2 of the corresponding digital signal is measured. This parameter can include, but is not limited to, a DC tone in baseband.

Finally at step 406, the IIP2 calibration circuits measuring the IIP2 will generate the appropriate compensation signal, or code, for application to the mixer circuit of the receive path. Once generated, the codes can be stored in non-volatile memory. Therefore the IIP2 calibration scheme need only be executed once to generate the code, as the system can access the code at any time. On the other hand, if the code is maintained only while the system is powered up, the code will be regenerated each time after power is restored to the system.

The aforementioned method steps 402 to 406 can be repeated for each receive path in the receiver core of the wireless transceiver. The number of times steps 402 to 406 is repeated depends on the number of test signal generators implemented on the chip. For example, with one test signal generator shared in a quad band wireless transceiver, steps 402 to 406 are repeated eight times (twice for each receive path having i and q signal paths). If each receive path had its own dedicated test signal generator and IIP2 calibration circuit, then steps 402 to 406 only need to be repeated two times.

The previously described embodiments of the invention disclose an on-chip built-in-self-test scheme for calibrating IIP2 for a wireless transceiver receiver core. The on-chip generation of an RF test signal is achieved by using predominantly native circuits of the wireless transceiver and minimal additional circuitry. The additional circuitry does not incur any significant design overhead, nor do they occupy significant area on the wireless transceiver chip. Thus the additional cost for implementing the automatic IIP2 calibration scheme in wireless transceivers is minimal. Since the calibration operation can be executed at any time, preferably at the system level after delivery to a user, IIP2 calibration is effectively a massively parallel process. Hence IIP2 testing and calibration time at the manufacturer stage is reduced to zero.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A second order intermodulation product (IIP2) calibration system for a wireless device comprising:
   a test signal generator including
      a transmitter core circuit including an oscillator circuit for generating a base frequency signal, and
      a test adaptor circuit for adding an offset signal corresponding to the second order tone to the base frequency signal, the test adaptor circuit generating the first RF signal in response to the base frequency signal;
   a receiver path having an input node for receiving the first RF signal, circuits for down-converting the first RF signal into a base band signal based on a receive frequency, and signal processing circuits for generating a digital data signal corresponding to the base band signal, the circuits receiving a compensation signal for minimizing the second order tone; and
   a calibration circuit for measuring said second order tone in said digital data signal and for generating the compensation signal.

2. The IIP2 calibration system of claim 1, wherein the transmitter core circuit includes
   a transmit clock generator circuit for generating the base frequency signal, and
   a transmit path circuit for receiving one of a data signal and the offset signal, the transmit path circuit mixing the base frequency signal with the offset signal to generate the first RF signal.

3. The IIP2 calibration system of claim 2, wherein the test adaptor circuit includes
   a test signal generator for generating the offset signal, and
   a switch circuit for selectively coupling the first RF signal to the input node.

4. The IIP2 calibration system of claim 3, wherein the offset signal is a preset digital signal and the transmit path circuit includes
   an analog to digital converter for converting the offset signal into an analog signal, and a mixer circuit for mixing the base frequency signal with the offset signal to provide the first RF signal.

5. The IIP2calibration system of claim 1, wherein the test adaptor circuit includes
an offset generator for providing the offset signal,
a mixing circuit for mixing a replica base frequency signal with the offset signal to provide the first RF signal, and
a switch circuit for selectively coupling the first RF signal to the input node of the receiver path in a test mode of operation.

6. The IIP2calibration system of claim 5, wherein the offset generator includes
a test signal generator for providing a digital test signal, and
a digital to analog converter for receiving the digital test signal, and for converting the digital test signal into an analog signal corresponding to the offset signal.

7. The IIP2calibration system of claim 6, wherein the digital to analog converter is a component of a transmit path circuit.

8. A method for on-chip generation of an radio frequency (RF) test signal having a second order tone, comprising:
a) generating a base frequency signal from a native circuit;
b) generating an offset signal corresponding to the second order tone with a test circuit, the offset signal being a preset digital test signal;
c) converting the offset signal into an analog signal; and,
d) mixing the base frequency signal with the offset signal to generate the RF test signal by a native transmit path circuit.

9. The method for on-chip generation of an RF test signal of claim 8, wherein the step of generating the base frequency includes enabling a receive clock generator circuit.

10. The method for on-chip generation of an RF test signal of claim 8, wherein the offset signal is an analog signal corresponding to a preset digital test signal.

11. The method for on-chip generation of an RF test signal of claim 10, including a step of converting the preset digital test signal into the analog signal.

12. The method for on-chip generation of an RF test signal of claim 8, wherein the step of generating the base frequency includes enabling a transmit clock generator circuit.

13. The method for on-chip generation of an RF test signal of claim 8, wherein a power amplifier of the native transmit path circuit is disabled while the RF test signal is generated.

14. A method for second order intermodulation (IIP2) testing and calibration of a wireless device, comprising:
a) detecting a calibration event;
b) generating a radio frequency (RF) test signal having a second order tone with native circuits of the wireless device by;
i) generating a base frequency signal by enabling a transmit clock generator circuit;
ii) generating a preset digital test signal corresponding to the second order tone with a test circuit;
iii) converting a preset digital test signal into an analog signal that corresponds to an offset signal; and,
iv) mixing the base frequency signal with the offset signal by a native transmit path circuit to generate the RF test signal;
c) propagating the RF test signal through a receive path of the wireless device;
d) measuring a parameter of the second order tone and generating a corresponding compensation signal; and
e) adjusting one or more circuits of the receive path with the compensation signal for minimizing the second order tone.

15. The method of claim 14, wherein the step of detecting includes detecting one of a power up reset event, power on event and any preset enabling event.

16. The method of claim 14, wherein the step of propagating includes coupling the RF test signal to the receive path in response to the calibration event.

17. The method of claim 14, wherein the step of detecting includes decoupling an antenna from the receive path.

18. The method for on-chip generation of an RF test signal of claim 14, wherein a power amplifier of the native transmit path circuit is disabled while the RF test signal is generated.

* * * * *